United States Patent
Nejad

(10) Patent No.: US 8,354,661 B2
(45) Date of Patent: Jan. 15, 2013

(54) VARIABLE RESISTANCE MEMORY DEVICE HAVING REDUCED BOTTOM CONTACT AREA AND METHOD OF FORMING THE SAME

(75) Inventor: Hasan Nejad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/166,362

(22) Filed: Jun. 22, 2011

(65) Prior Publication Data

US 2011/0303889 A1    Dec. 15, 2011

Related U.S. Application Data

(62) Division of application No. 11/798,459, filed on May 14, 2007, now Pat. No. 7,989,251.

(51) Int. Cl.
*H01L 47/00* (2006.01)
(52) U.S. Cl. .................... 257/4; 257/E27.002
(58) Field of Classification Search ........ 257/4, E27.002
See application file for complete search history.

(56) References Cited

U.S. PATENT DOCUMENTS

| 2006/0138467 A1* | 6/2006 | Lung .................. 257/209 |
| 2006/0176724 A1* | 8/2006 | Asano et al. ............ 365/105 |
| 2006/0209585 A1 | 9/2006 | Tanizaki et al. |
| 2007/0020799 A1 | 1/2007 | Choi et al. |

OTHER PUBLICATIONS

K. Goto et al., "Co Salicide Compatible 2-step Activation Annealing Process for Deca-nano Scaled MOSFETs," 1999 Symposium on VLSI Technology Digest of Technical Papers, pp. 49-50.

* cited by examiner

*Primary Examiner* — Bradley K Smith
(74) *Attorney, Agent, or Firm* — Dickstein Shapiro LLP

(57) ABSTRACT

A variable resistance memory element and method of forming the same. The memory element includes a substrate supporting a bottom electrode having a small bottom contact area. A variable resistance material is formed over the bottom electrodes such that the variable resistance material has a surface that is in electrical communication with the bottom electrode and a top electrode is formed over the variable resistance material. The small bottom electrode contact area reduces the reset current requirement which in turn reduces the write transistor size for each bit.

4 Claims, 12 Drawing Sheets

VARIABLE RESISTANCE MEMORY DEVICE HAVING REDUCED BOTTOM CONTACT AREA AND METHOD OF FORMING THE SAME

CROSS-REFERENCE TO RELATED APPLICATIONS

This application is a divisional of U.S. patent application Ser. No. 11/798,459, filed on May 14, 2007 now U.S. Pat. No. 7,989,251, the subject matter of which is incorporated in its entirety by reference herein.

FIELD OF THE INVENTION

Embodiments of the invention relate to semiconductor devices, and in particular to variable resistance memory elements and methods of forming and using the same.

BACKGROUND OF THE INVENTION

Non-volatile memories are important elements of integrated circuits due to their ability to maintain data absent a power supply. Several different typical resistance memory elements using different materials have been suggested for such use. Variable resistance memory elements can be programmed to a resistance value as a way of storing logic data. One suggested type of resistance memory employs phase change materials such as chalcogenide alloys, which are capable of stably transitioning between amorphous and crystalline phases. Each phase exhibits a particular resistance state and the resistance states distinguish the logic values of the memory element. Specifically, an amorphous state exhibits a relatively high resistance, and a crystalline state exhibits a relatively low resistance.

FIG. 1A shows a basic composition of a variable resistance memory cell 10, which may be implemented using a variable resistance material, and which is constructed over a substrate 11. A variable resistance material 16 is formed between a bottom electrode 14 and a top electrode 18. The bottom electrode is located within an insulating layer 12. The material used to form the electrodes 14, 18 can be selected from a variety of conductive materials, such as tungsten, nickel, tantalum, titanium, titanium nitride, aluminum, platinum, or silver, among others.

Much research has focused on variable resistance memory devices using chalcogenides. Chalcogenides are alloys of Group VI elements of the periodic table, such as tellunium ("Te") or selenium ("Se") or germanium ("Ge"). A specific chalcogenide currently used in rewriteable compact discs ("CD-RWs") is $Ge_2Sb_2Te_5$. In addition to having valuable optical properties that are utilized in CD-RW discs, $Ge_2Sb_2Te_5$ also has desirable physical properties as a variable resistance material, i.e., phase change material or GST material. For example, various combinations of Ge, antimony ("Sb") and Te may be used as variable resistance materials. Specifically, GST material can change structural phases between an amorphous phase and two crystalline phases. The resistance of the amorphous phase ("a-GST") and the resistances of the cubic and hexagonal crystalline phases ("c-GST" and "h-GST," respectively) can differ significantly. The resistance of amorphous GST is greater than the resistances of either cubic GST or hexagonal GST, whose resistances are similar to each other. Thus, in comparing the resistances of the various phases of GST, GST may be considered a two-state material (amorphous GST and crystalline GST), with each state having a different resistance that can be equated with a corresponding binary state. A variable resistance material such as GST whose resistance changes according to its material phase is referred to as a phase change material. The transition from one GST phase to another occurs in response to temperature changes of the GST material.

In a variable resistance memory cell, heating and cooling of the GST material can occur by causing differing amplitudes of current to flow through the GST material. The GST material is placed in a crystalline state by passing a crystallizing current through the GST material, thus warming the GST material to a temperature wherein a crystalline structure may grow. A stronger melting current is used to melt the GST material for subsequent cooling to an amorphous state. As the typical phase change memory cell uses the crystalline state to represent one logic value, e.g., a binary "1," and the amorphous state to represent another logic value, e.g., a binary "0," the crystallizing current is typically referred to as a write current $I_W$ and the melting current is referred to as an erase or reset current $I_{RST}$. One skilled in the art will understand, however, that the assignment of GST states to binary values may be switched if desired.

The state of the GST material is determined by applying a small read voltage $V_r$ across the two electrodes and by measuring the resultant read current $I_r$. A lower read current $I_r$ corresponds to a higher resistance $I_r$ where the GST material is in an amorphous state and a relatively high read current $I_r$ corresponds to a lower resistance where the GST material is in a crystalline state.

The phase-changing current is applied to the GST material via a pair of electrodes. In FIG. 1B, for example, the phase-changing currents are applied via the bottom electrode 14 and the top electrode 18. Because of the configurations of the bounding surface areas of the two electrodes 14, 18, current densities 50 within the GST material are not equally distributed. In particular, current densities 50 near the bottom electrode 14 are greater than the densities near the top electrode 18. Furthermore, areas of the GST material that are directly in between the two electrodes 14, 18 have higher current densities 50 than areas that are not directly in between the two electrodes 14, 18 such as areas near the lower corners of the GST material.

A sought after characteristic of non-volatile memory is low power consumption. Often, however, conventional variable resistance memory elements require large operating currents. It is therefore desirable to provide variable resistance memory elements with reduced current requirements. For variable resistance memory elements, it is necessary to have a current density that will heat the variable resistance material past its melting point and quench it in an amorphous state. One way to increase current density is to decrease the size of the bottom electrode. These methods maximize the current density at the bottom electrode interface to the variable resistance material. Although conventional solutions are typically successful, it is desirable to further reduce the overall current in the variable resistance memory element, thereby reducing power consumption in certain applications.

DETAILED DESCRIPTION OF THE INVENTION

In the following detailed description, reference is made to various specific embodiments. These embodiments are described with sufficient detail to enable those skilled in the art to practice the claimed invention. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit structure, including, but not limited to, metals, alloys, glasses, polymers, ceramics, and any other supportive materials as is known in the art.

The embodiments of the invention are now explained with reference to the figures, which throughout which like reference numbers indicate like features. FIGS. 2-14 illustrate an example process for forming a variable resistance memory element 100 which has smaller electrodes than other phase change memory devices and which can operate with reset currents which are smaller compared with other phase change memory devices.

In order to reduce the reset current requirement for a writing bit, the embodiments herein describe process flows for producing a sub 1000 $nm^2$ bottom contact area that provides excellent contact area uniformity across a wafer. The small bottom electrode contact area reduces the reset current requirement, which in turn reduces the write transistor size for each bit. The resulting contact area is very scalable and the only variation is the critical dimension ("CD") control of the bit lines in one direction. Several methods of contact area reduction are known in the art including contact hole CD reduction using a spacer, annular donut shaped contacts, and edge contacts. The embodiments described herein, however, provide advantages over the known methods and results in CD/area uniformity control and printing and etching only straight lines with only one direction CD control.

Figure 1A:
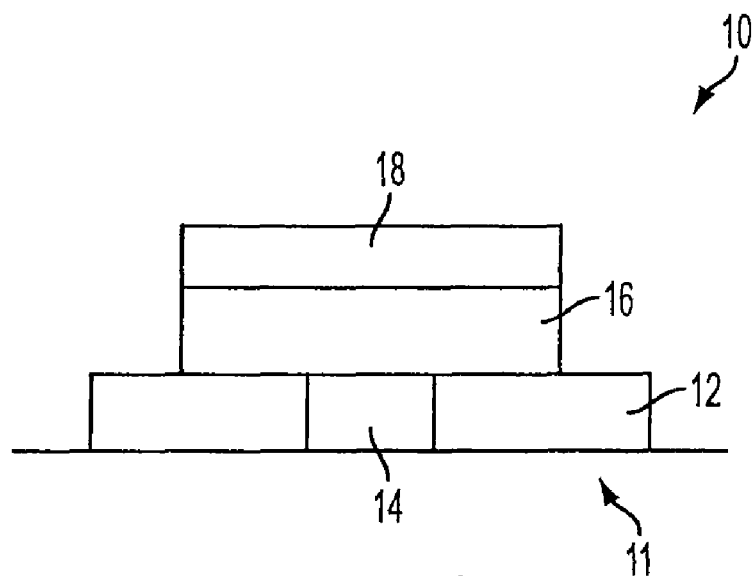
FIGS. 1A and 1B illustrate a prior art variable resistance memory cell.
Figure 1B:
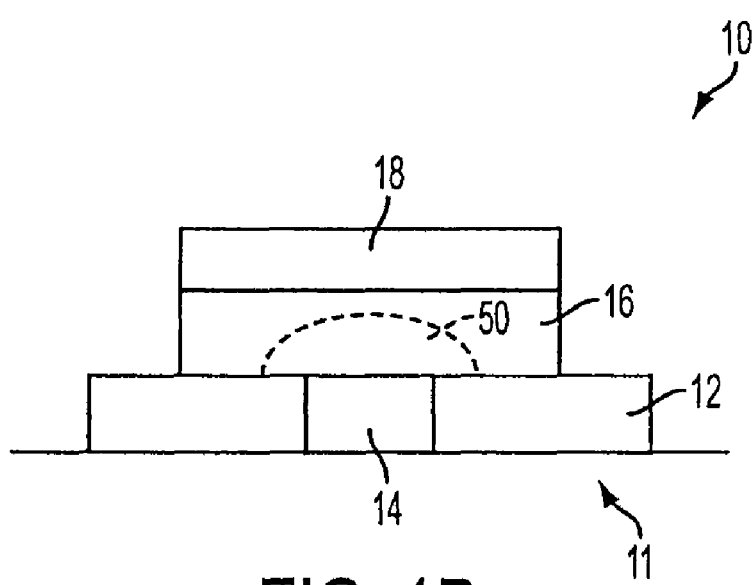
Figure 2:
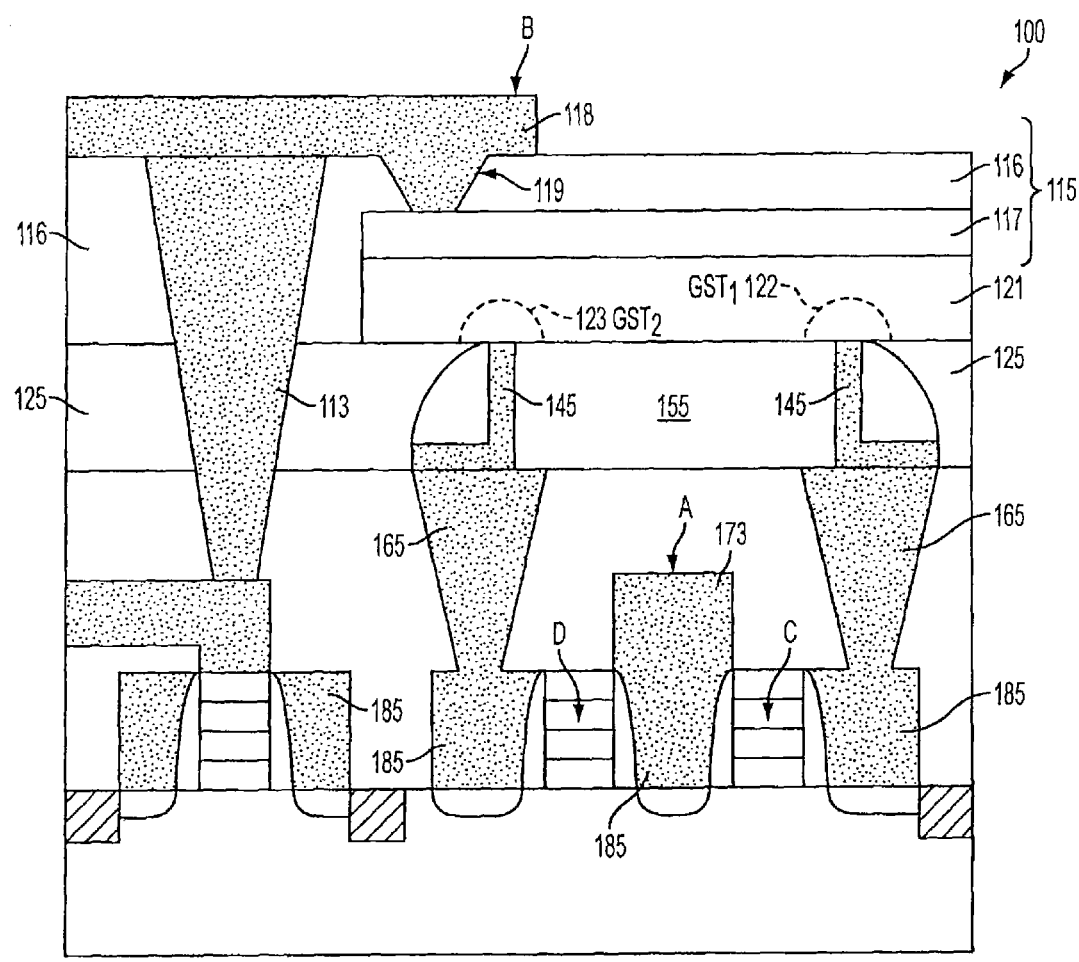
FIG. 2 illustrates an embodiment of the invention described herein.

The resulting variable resistance memory element, e.g., phase change memory element, shown in an embodiment depicted by FIG. 2, includes a substrate supporting bottom electrodes 145 having a sub 1000 $nm^2$ bottom contact area. A phase change material 121 is formed over the bottom electrodes 145 such that the phase change material 121 has a surface that is in electrical communication with the bottom electrode 145. A top electrode 117 is formed over the phase change material 121 and is in electrical communication with phase change material 121 and bottom electrode 145. One method of forming the FIG. 2 structure is now described.

Figure 3:
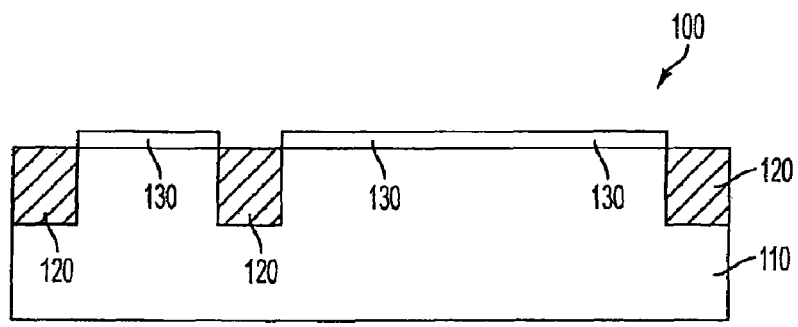
FIG. 3 illustrates the embodiment of FIG. 2 at an initial stage of processing.
Figure 4:
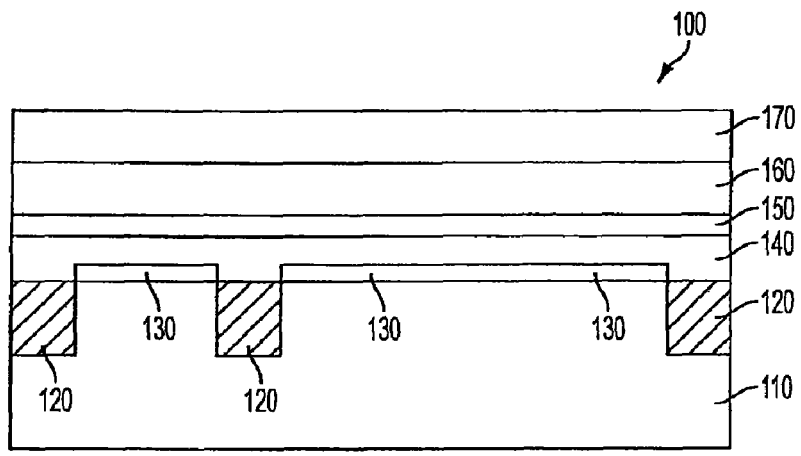
FIG. 4 illustrates the embodiment of FIG. 2 at a stage of processing subsequent to that shown in FIG. 3.

Referring to FIG. 3, a gate oxide material 130 is formed on top of a substrate 110 having STI regions 120 formed therein. The gate oxide material 130 is removed from above the STI regions 120. Next, as shown in FIG. 4, a conductive material 140, e.g., a polysilicon material, is blanket deposited, and then a metal material 150, i.e., a Ti/WN material, is blanket deposited. Then, a tungsten (W) material 160 is blanket deposited, and finally a nitride material 170 is blanket deposited. Each material is blanket deposited above the previously formed material. Blanket deposition can be done by known methods. Materials 130, 140, 150, 160 and 170 comprise the materials that will form transistor gate stacks (described below). It should be appreciated that the gate stacks can also be formed in a number of different combinations and/or of different materials.

Figure 5:
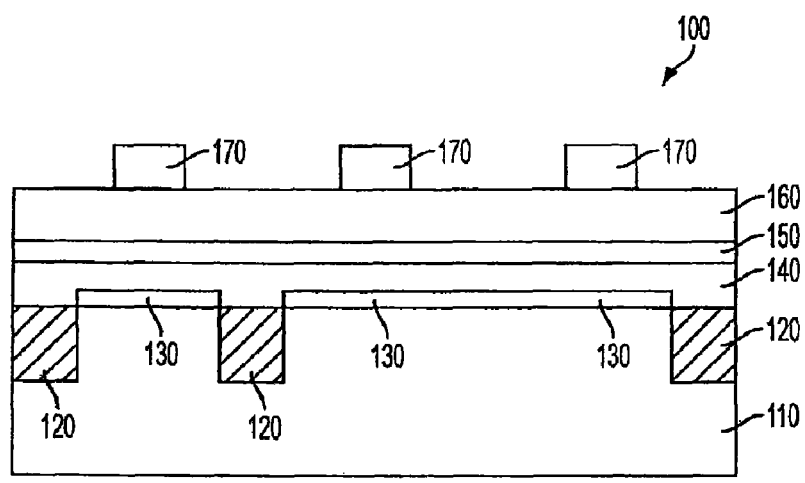
FIG. 5 illustrates the embodiment of FIG. 2 at a stage of processing subsequent to that shown in FIG. 4.
Figure 6:
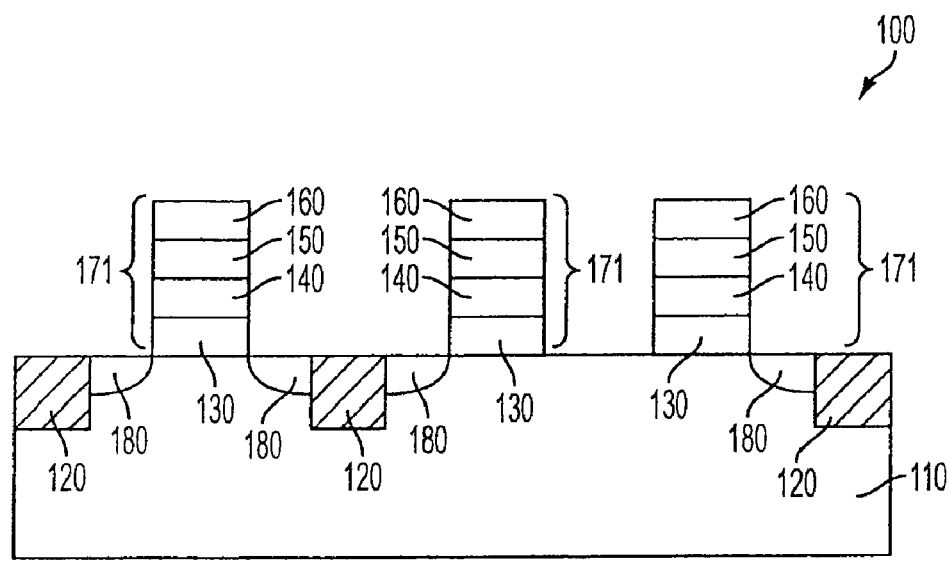
FIG. 6 illustrates the embodiment of FIG. 2 at a stage of processing subsequent to that shown in FIG. 5.
Figure 7:
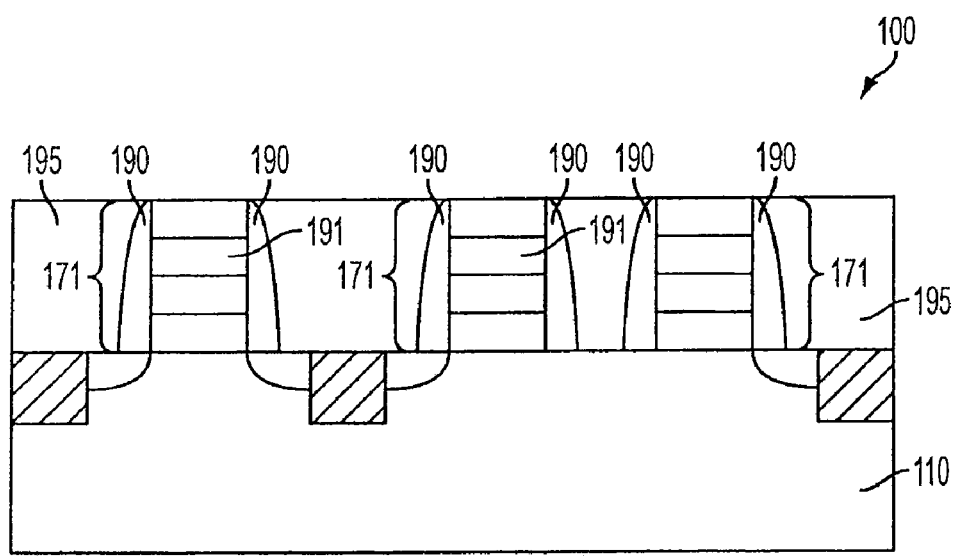
FIG. 7 illustrates the embodiment of FIG. 2 at a stage of processing subsequent to that shown in FIG. 6.
Figure 8:
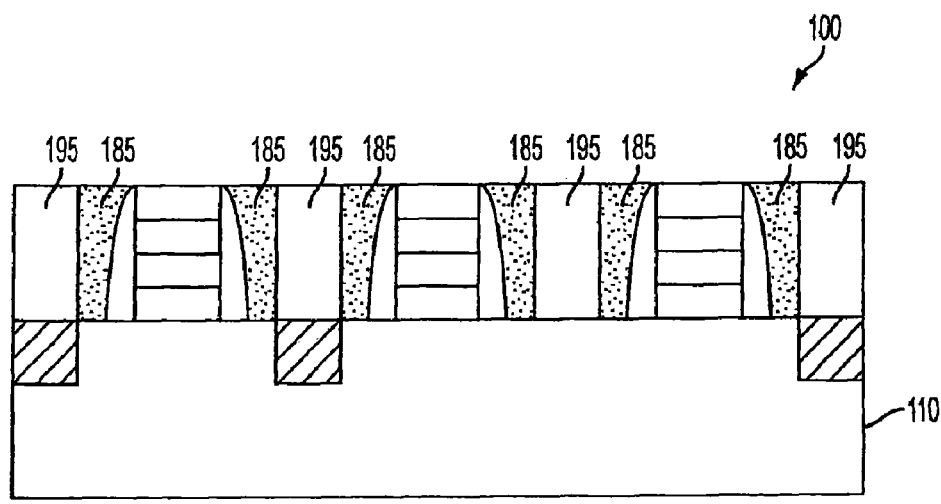
FIG. 8 illustrates the embodiment of FIG. 2 at a stage of processing subsequent to that shown in FIG. 7.

As shown in FIG. 5, nitride material 170 is etched except for areas above where the desired gate stacks will be formed. Any etching method known in the art can be used such as using photolithography mask and wet or dry etching techniques. Using nitride material 170 as a mask, materials 140, 150 and 160 are etched by any technique, as shown in FIG. 6, to form the desired gate stacks 171. Then, source/drain regions 180 are formed in the substrate 110 on both sides of the gate stacks 171. It should be appreciated that the source/drain regions 180 are preferably formed after gate stacks 171 have been formed, however, they may be also formed before the gate stack materials 130, 140, 150, and 160 are blanket deposited. A nitride spacer 190 is then deposited and etched to form sidewalls 191 of the gate stacks 171. An insulating material 195 is deposited and planarized to fill-in the space between each gate stack 171, as shown in FIG. 7. The insulating material 195 is typically formed of a boron-phosphate-silicon-glass (BPSG), but can be formed using any other known insulating material. Subsequently, as shown in FIG. 8, conductive plugs 185 (also referred to as local interconnects) are formed. The conductive plugs 185 are formed by etching trenches in insulating layer 195 and then filling the trenches with a metal or conductive material followed by planarizing any excess metal material from above insulating material 195. Chemical mechanical planarization (CMP) or other known methods can be used to remove the excess metal material from the surface of the insulating material 195. The conductive plugs 185 may be any generally known conductive material that is used in the art such as tungsten, platinum, gold, copper, aluminum, etc.

Figure 9:
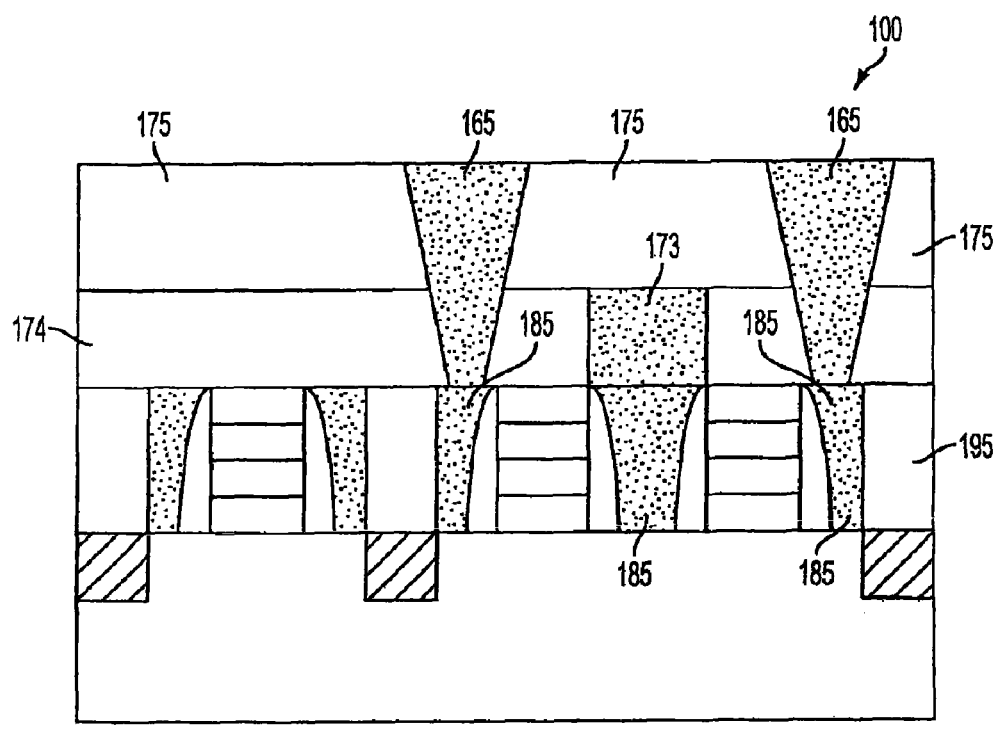
FIG. 9 illustrates the embodiment of FIG. 2 at a stage of processing subsequent to that shown in FIG. 8.

As shown in FIG. 9, an insulating material 174 is blanket deposited above insulating material 195. Within insulating material 174, a trench is etched and filled with a bit line 173 above one of the conductive plugs 185. Then, another layer of insulating material 175 is deposited above insulating material 195, the previously deposited insulating material 174 and the metal bit line 173. After insulating material 175 is deposited, another set of trenches are etched into insulating material 175 and another set of conductive plugs 165 are formed. The conductive plugs 165 are formed by filling the trenches with a metal or conductive material and planarizing the excess material from above insulating material 175. Conductive plugs 165 extend conductive plugs 185 to the top surface of insulating material 175.

Figure 10:
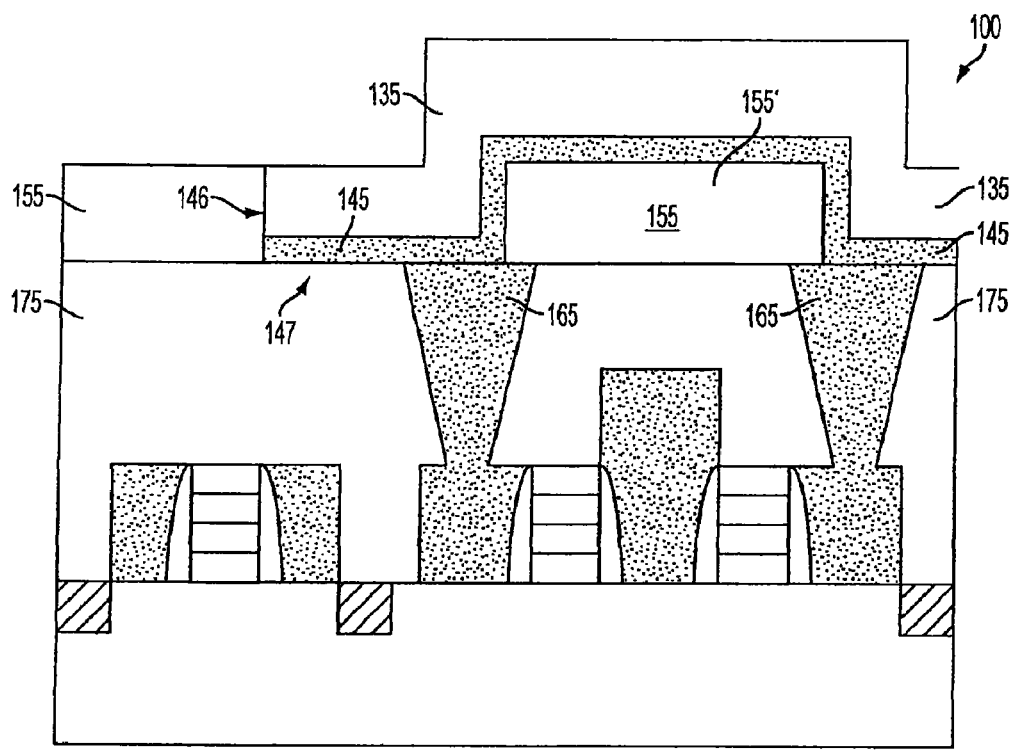
FIG. 10 illustrates the embodiment of FIG. 2 at a stage of processing subsequent to that shown in FIG. 9.
Figure 11:
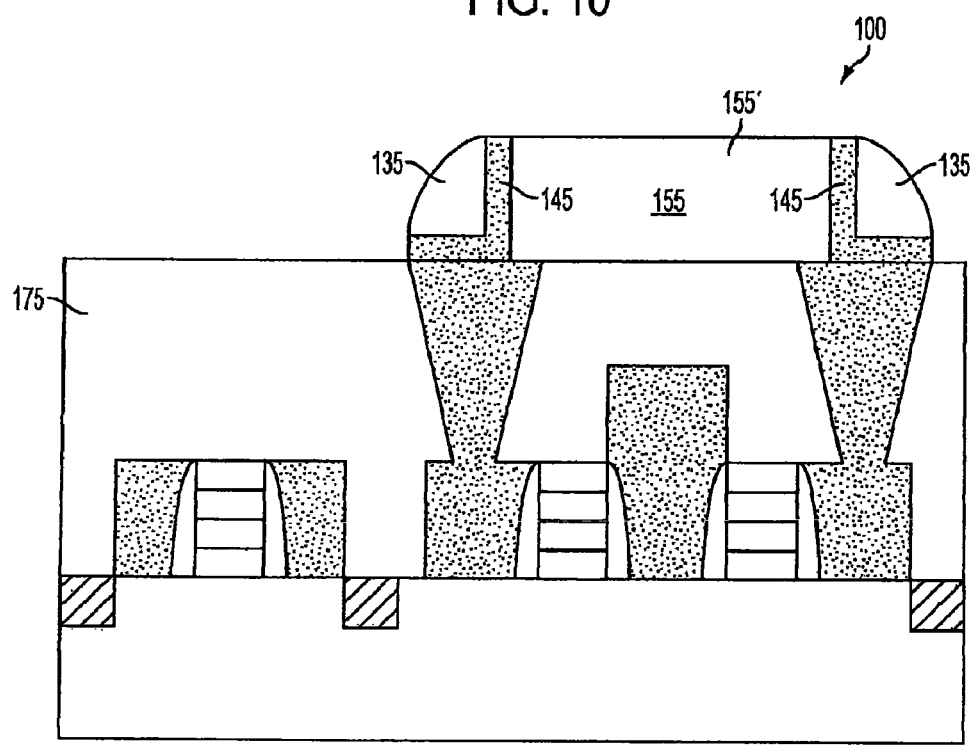
FIG. 11 illustrates the embodiment of FIG. 2 at a stage of processing subsequent to that shown in FIG. 10.

Referring to FIG. 10, another insulating material 155 is formed above insulating material 175 and conductive plugs 165. Then, trenches 147 are etched into insulating material 155 being a patterned area 155' on either side of the trenches. Any etching method known in the art can be used to etch the trenches. A metal material 145, preferably TiN, is deposited within the trenches 147 and above insulating materials 155 and 175. Then, a nitride material 135 is blanket deposited above metal material 145. The nitride material 135 and metal material 145 are etched back and removed, preferably a spacer etch, from above insulating material 155, as shown in FIG. 11.

Figure 12:
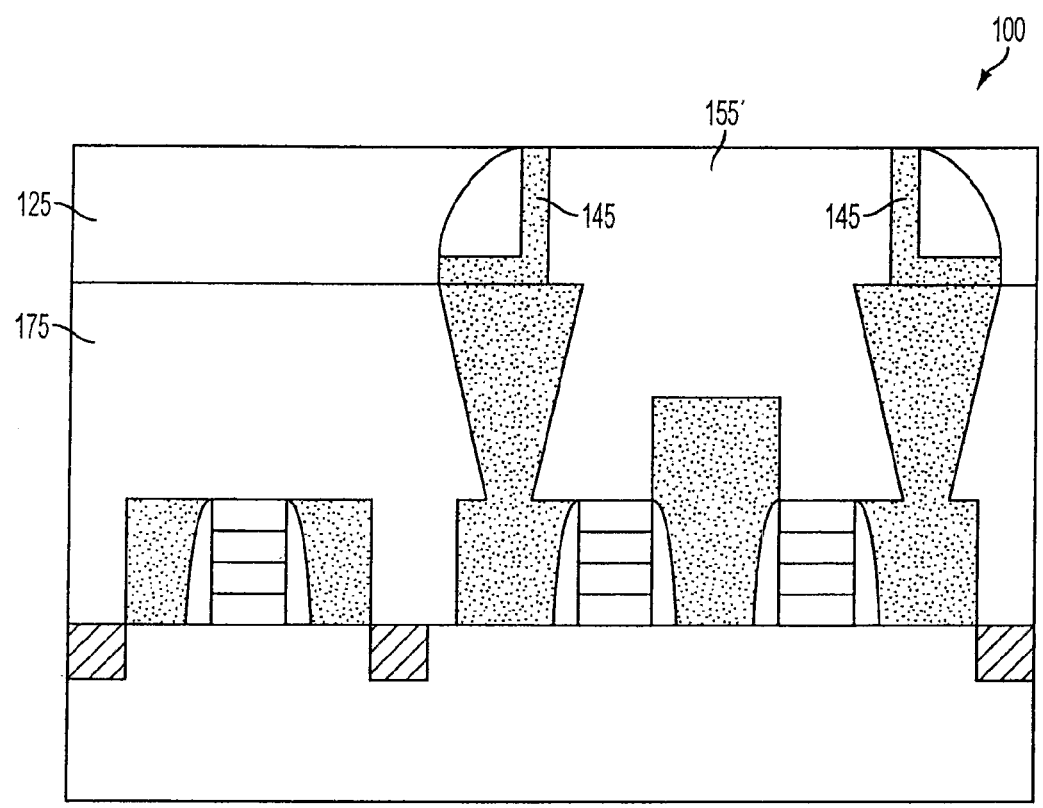
FIG. 12 illustrates the embodiment of FIG. 2 at a stage of processing subsequent to that shown in FIG. 11.
Figure 13A:
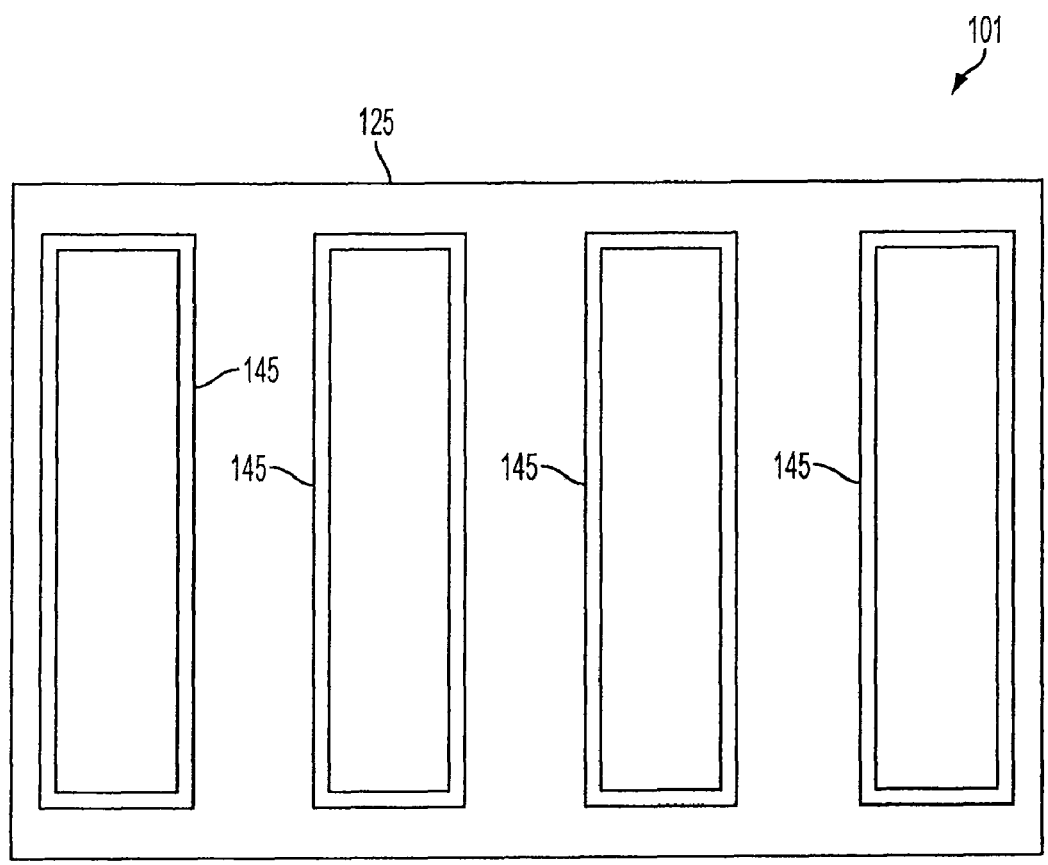
FIG. 13A illustrates a top-down perspective view at the processing state illustrated in FIG. 12
Figure 13B:
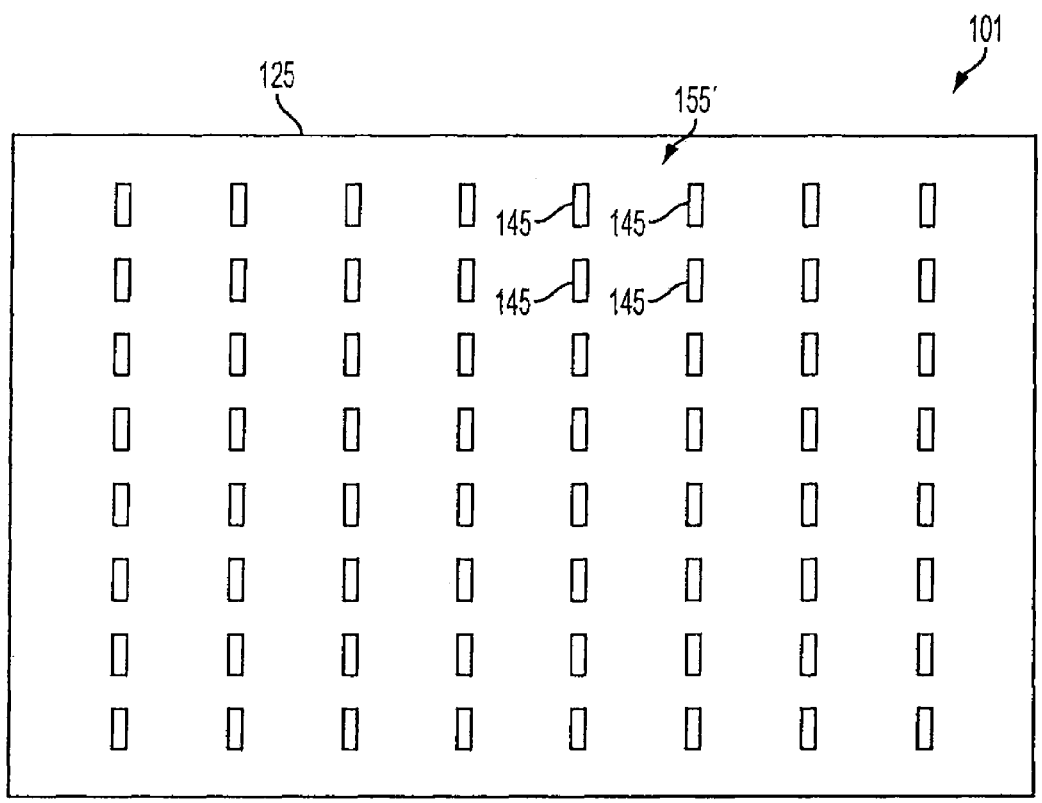
FIG. 13B illustrates a top-down view at a stage of processing subsequent to that shown in FIG. 13A, of a memory array according to an embodiment described herein.

The surface of insulating material patterned area 155' and portions of insulating material 175 are exposed. FIG. 12 shows another insulating material 125 which is formed above insulating materials 155 and 175. FIGS. 13A and 13B illustrate a memory array 101 from a top-down perspective view at the processing state illustrated in FIG. 12. As shown in the top-down perspective of FIG. 13A, the top edges of metal material 145 remains exposed at the surface of insulating material 125. Materials 125, 145 are patterned etched perpendicular to the formed metal material 145 lines and etched down to insulating area 155' and portions of insulating material 175. Then, an insulating material is blanket deposited and is planarized to the top level of insulating area 155' (FIG. 13B) to expose the top edges of the formed metal material 145. The resulting metal material 145, which forms a bottom electrode, is preferably formed in an l-shaped configuration (FIG. 2). Metal material 145, however, can be formed in a number of various shapes given that the top surface or exposed surface of the shape provides a small contact area. Each contact, bottom electrode 145 is individually isolated by the insulating material 125. In other words, no direct conductive path exists from one bottom electrode 145 to another.

The metal material 145, which serves as a bottom electrode to the formed phase change memory element 100 (FIG. 2), is visible at predetermined spaced distances throughout the array 101. The remaining visible surface of the array 101 is comprised of insulating material 125 and areas 155'.

Referring back to FIG. 2, a phase change material 121 is thereafter deposited onto the planarized bottom electrodes 145 and the insulating materials 125, 155'. The phase change material 121 may be any of the various variable resistance materials listed above or may be a specific composition of GST. A top electrode 117 is deposited on top of the phase change material 121 by any method. For example, the phase change material 121 and top electrode 117 may be blanket deposited one after the other and then etched back to the top level of insulating material 155 to form memory elements with a top electrode. Thereafter, another insulating layer 116 is formed and planarized and trenches 119, 113 etched and filled with a conductive material 118. The top electrode 117 is generally, but not required to be, formed of the same material as the bottom electrode 145. Metal material 118 connects and provides an electrical connection through trench 119 to top electrode 117. Metal material 118 is blanket deposited and patterned such that a portion is removed from insulating material 116.

Figure 14:
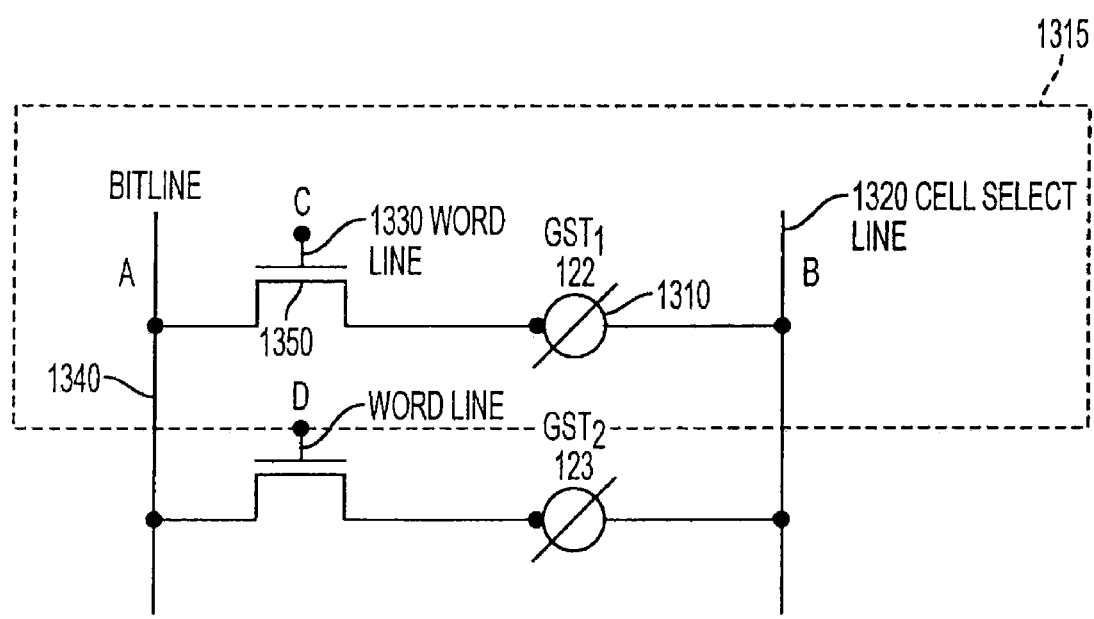
FIG. 14 illustrates an electrical schematic of a memory cell according to an embodiment described herein.

Referring to FIGS. 2 and 14, the final structure comprises electrodes A, B respectively forming a bit line and cell select line, phase change memory elements GST1, GST2, 122, 123 as well as transistor gates C, D formed as respective word lines. FIG. 14 reflects an electrical schematic corresponding to the structure depicted in FIG. 2. Conductive plugs 165, 185 form an electrical communication between bit line 173 and electrodes 145, 117. Electrodes 145, 177 can continue electrical communication via conductive materials 118, 119 to periphery circuitry through periphery conductive plugs such as conductive plug 113. The described electrical communication paths correspond to the electrical schematics and illustrations of FIGS. 14-16.

The resulting phase change memory element has a low power consumption and provides reduced current requirements by achieving a small bottom contact area for electrodes 145 which, as noted, has an area of less than 1000 nm$^2$. Although having a smaller bottom contact area than other phase change memory elements, the memory element still achieves an increased current density that will heat the phase change material past its melting point and quench it in an amorphous state. This maximizes the current density at the bottom electrode interface to the phase change material.

FIG. 14 also labels one memory cell 1315 as having a bit line 1340, a cell select line 1320, a word line 1330 and a memory element 1310. The memory element 1310 is connected to a cell select line 1320 via top electrode B. The other memory element electrode 145 is connected to an access transistor 1350. The access transistor 1350 is gated by a word line 1330. Bit line 1340 provides a source to the access transistor 1350 and is connected to the memory element 1310 when the access transistor 1350 is activated by the word line 1330.

Figure 15:
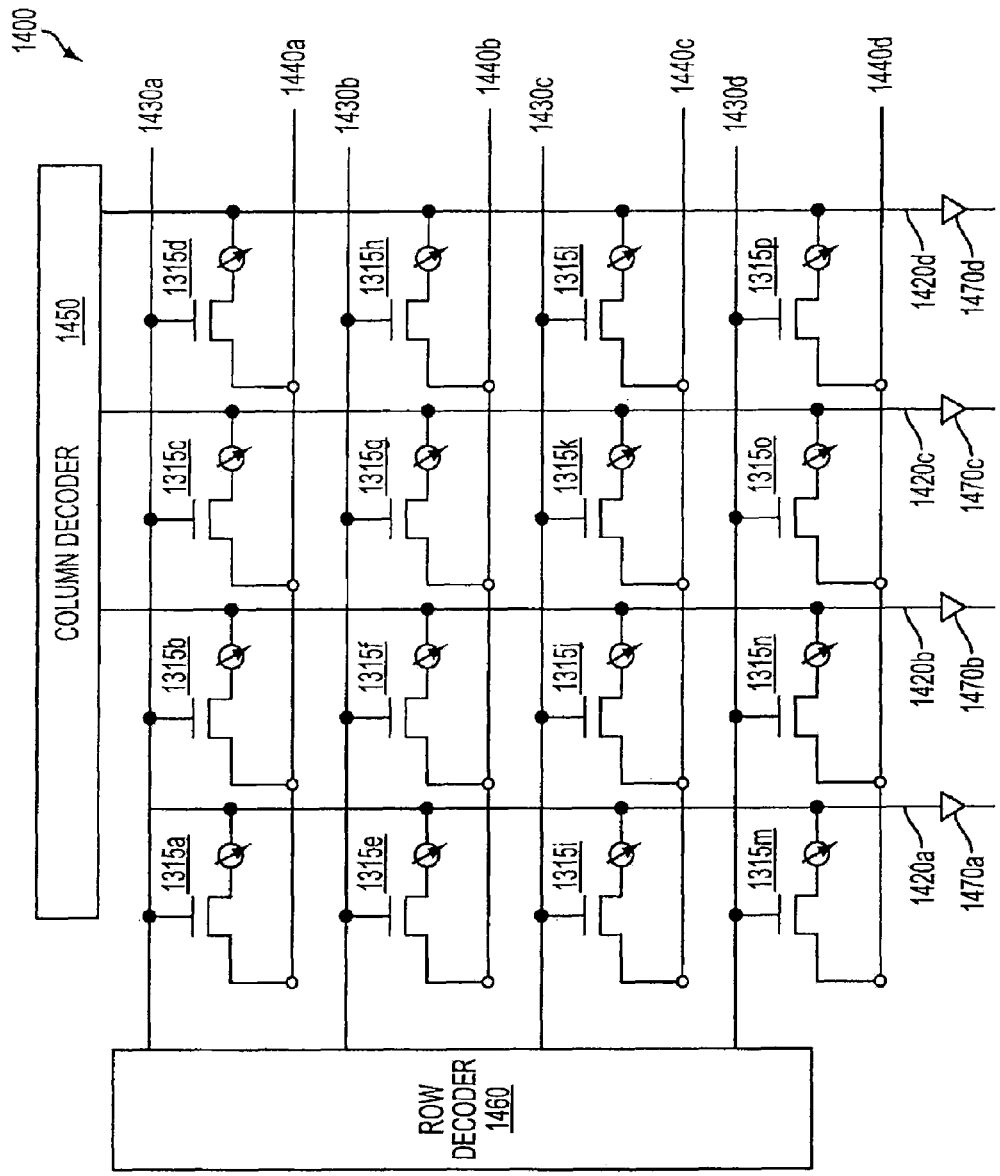
FIG. 15 illustrates an array of phase change memory bit structures according to an embodiment described herein.

The memory cell 1315 of FIG. 14 may be arranged in an array of like memory cell structures, as illustrated in FIG. 15. In FIG. 15, a memory device 1400 includes one or more arrays of memory bit structures 1315a-1315p. The memory cell structures 1315a-1315p are arranged in rows and columns. The rows and columns may be partially staggered or may be aligned as a simple parallel grid as in FIG. 15. The memory cell structures 1315a-1315p along any given cell select line 1420a-1420d do not share a common word line 1430a-1430d. Additionally, the memory cell structures 1315a-1315p along any given cell select line 1420a-1420d do not share a common bit line 1440a-1440d. In this manner, each memory bit structure is uniquely identified by the combined selection of the word line to which the gate of the memory cell access device is connected, and the cell select line to which the memory cell is connected.

Each word line 1430a-1430d is connected to a word line driver in the form of a row decoder 1460 for selecting the respective word line for an access operation. Similarly, each cell select line 1420a-1420d is coupled to a driver in the form of a column decoder 1450. The current passing through a selected memory bit structure 1315a-1315p is measured by sense amplifiers 1470a, 1470d connected respectively to the cell select lines 1420a-1420d.

For simplicity, FIG. 15 illustrates a memory array having only four rows of memory cell structures 1315a-1315p on four cell select lines 1420a-1420d and four columns of memory cell structures 1315a-1315p on four word lines 1430a-1430d. However, it should be understood that in practical applications, the memory device 1400 has significantly more memory cell structures in one or more arrays.

Figure 16:
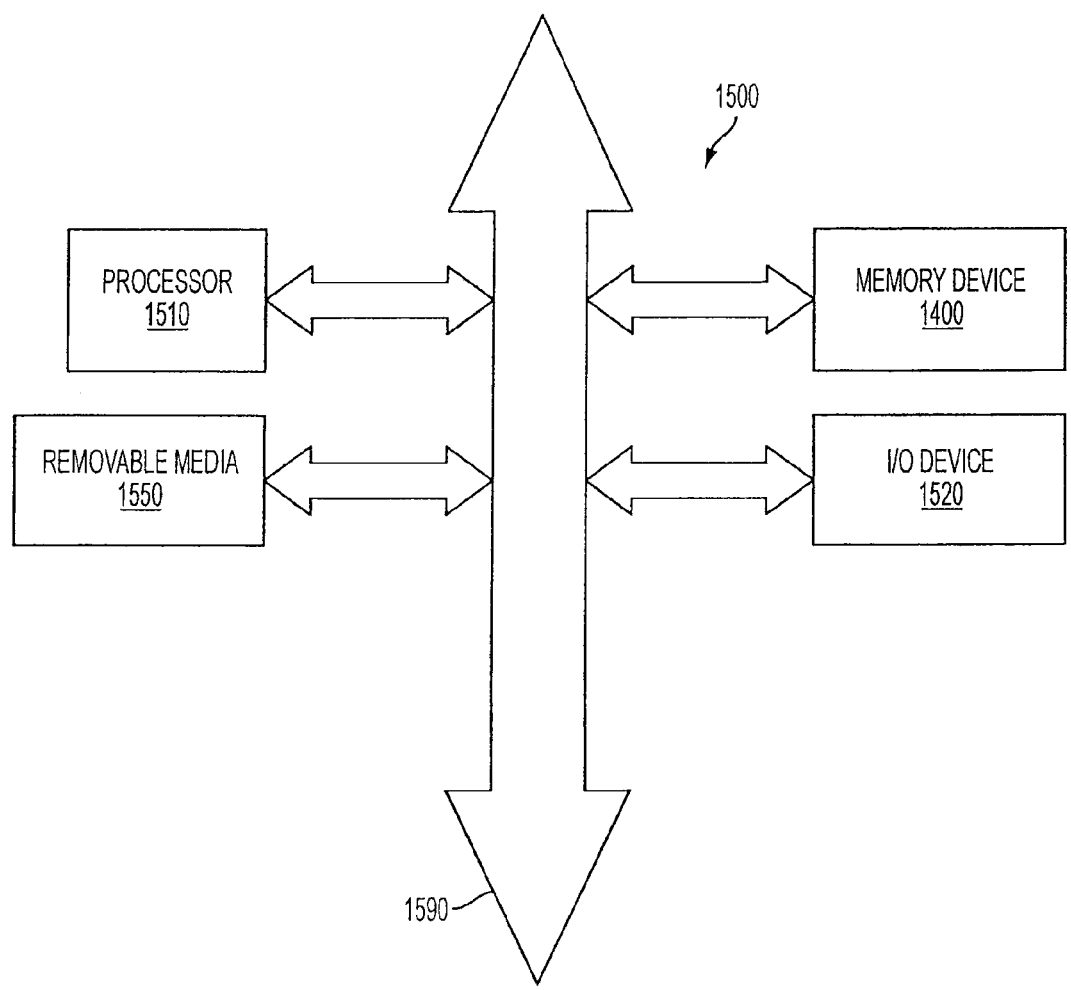
FIG. 16 illustrates a processor system that includes a memory device according to an embodiment described herein.

It should be appreciated that the improved phase change memory cell 100 may be fabricated as part of an integrated circuit. The corresponding integrated circuits may be utilized in a typical processor system. For example, FIG. 16 illustrates a simplified processor system 1500 which includes a memory device 1400 employing improved phase change memory cells in accordance with the above described embodiments. A processor system, such as a computer system, generally comprises a central processing unit (CPU) 1510, such as a microprocessor, a digital signal processor, or other programmable digital logic devices, which communicates with an input/output (I/O) device 1520 over a bus 1590. The memory device 1400 communicates with the CPU 1510 over bus 1590, typically through a memory controller.

In the case of a computer system, the processor system may include peripheral devices such as removable media devices 1550 which communicate with CPU 1510 over the bus 1590. Memory device 1400 is preferably constructed as an integrated circuit, which includes one or more phase change memory devices. If desired, the memory device 1400 may be combined with the processor, for example CPU 1510, as a single integrated circuit.

It should also be appreciated that various embodiments have been described as using a phase change material as an exemplary variable resistance material. The invention may also be used in other types of resistive memory to improve current flow through whatever variable resistance material is used.

The above description and drawings should only be considered illustrative of example embodiments that achieve the features and advantages described herein. Modification and substitutions to specific process conditions and structures can be made. Accordingly, the invention is not to be considered as being limited by the foregoing description and drawings, but is only limited by the scope of the appended claims.

What is claimed as new and desired to be protected by Letters Patent of the United States is:

1. A phase change memory array comprising:
    a plurality of word lines;
    a plurality of cell select lines;
    a plurality of bit lines; and
    a plurality of phase change memory bit structures, each structure including an access device and a phase change memory element, the memory element being connected with one of the plurality of cell select lines and coupled with one of the plurality of bit lines through the access device gated by one of the plurality of word lines, each memory element comprising:
    an insulating structure;
    a bottom electrode formed between the insulating structure and a nitride spacer;
    a variable resistance material with a first surface and a second surface, the first surface abutting a top portion of the bottom electrode and portions of the insulating layer; and
    a top electrode in electrical communication with the second surface of the variable resistance material.

2. The phase change memory array of claim 1, wherein the top portion of said bottom electrode has a contact area of less than 1000 nm2.

3. The phase change memory array of claim 1, wherein the bottom electrode has an L-shaped configuration.

4. The phase change memory array of claim 1, wherein the variable resistance material is a phase change material.

* * * * *

UNITED STATES PATENT AND TRADEMARK OFFICE
CERTIFICATE OF CORRECTION

PATENT NO. : 8,354,661 B2
APPLICATION NO. : 13/166362
DATED : January 15, 2013
INVENTOR(S) : Hasan Nejad It is certified that error appears in the above-identified patent and that said Letters Patent is hereby corrected as shown below:

In column 8, line 28, in Claim 2, change "nm2" to -- $nm^2$ --, therefor.

Signed and Sealed this
Second Day of April, 2013

Teresa Stanek Rea
*Acting Director of the United States Patent and Trademark Office*